(12) United States Patent
Thompson et al.

(10) Patent No.: US 7,393,236 B2
(45) Date of Patent: Jul. 1, 2008

(54) INTEGRATED THERMAL AND ELECTRICAL CONNECTION SYSTEM FOR POWER DEVICES

(75) Inventors: Alex Thompson, Fullerton, CA (US); Mark D. Korich, Chino Hills, CA (US); Mark L Selogie, Hermosa Beach, CA (US); Keming Chen, Torrance, CA (US)

(73) Assignee: GM Global Technology Operations, Inc., Detroit, MI (US)

( * ) Notice: Subject to any disclaimer, the term of this patent is extended or adjusted under 35 U.S.C. 154(b) by 116 days.

(21) Appl. No.: 11/219,228

(22) Filed: Sep. 2, 2005

(65) Prior Publication Data

US 2007/0053163 A1 Mar. 8, 2007

(51) Int. Cl.
*H01R 13/00* (2006.01)
(52) U.S. Cl. ........................... 439/487; 361/711
(58) Field of Classification Search ............. 439/212, 439/721, 65, 213, 485, 487
See application file for complete search history.

(56) References Cited

U.S. PATENT DOCUMENTS

| 4,965,658 | A | * | 10/1990 | Norbeck et al. | 257/712 |
| 5,177,666 | A | * | 1/1993 | Bland et al. | 361/689 |
| 6,404,628 | B1 | * | 6/2002 | Nagashima et al. | 361/690 |
| 7,068,507 | B2 | * | 6/2006 | Pfeifer et al. | 361/699 |
| 2004/0160731 | A1 | * | 8/2004 | Yamaguchi | 361/600 |
| 2005/0047044 | A1 | * | 3/2005 | Nolden et al. | 361/103 |

* cited by examiner

*Primary Examiner*—Renee S Luebke
*Assistant Examiner*—Vanessa Girardi

(57) ABSTRACT

An electrical system as described herein is suitable for use in an electric or hybrid vehicle. The electrical system includes electrical devices, such as power transistors, coupled to an electrically and thermally conductive bus bar. The respective nodes of the electrical devices are coupled to the bus bar such that the bus bar carries a combined signal generated by the electrical devices. The bus bar is also thermally coupled to a conduction heat transfer system, such as a liquid cooled cold plate. Thus, the bus bar functions as both an electrical conduit and a conduction-based heat sink for the electrical system.

5 Claims, 5 Drawing Sheets

INTEGRATED THERMAL AND ELECTRICAL CONNECTION SYSTEM FOR POWER DEVICES

TECHNICAL FIELD

The present invention generally relates to electronic systems, and more particularly relates to a connection system for power devices that provides both an electrical connection for the devices and a thermal connection for heat transfer purposes.

BACKGROUND

Electrical power devices, such as high power transistors, are utilized in many systems for many practical applications. For example, such devices may be found in a DC-to-DC converter for electric or hybrid vehicles. In this context, a DC-to-DC converter can be used to convert a relatively high DC battery voltage (e.g., 42 or 300 volts) into a relatively low DC voltage (e.g., 12 volts). In this example application and other practical applications, a number of power devices may be connected in parallel to generate a combined output signal. In operation, the power devices can generate a large amount of heat.

A practical high power device typically includes a thermal plate or case that is designed to manage the heat generated by the device. Finned heat sinks and/or fans are often utilized to cool high power devices via thermal convection techniques. The use of heat sinks and fans can be undesirable in some applications, particularly those that have physical size and/or cost restraints.

Accordingly, it is desirable to have an electrical system for high power devices that is compact in size, has less parts than conventional systems, provides direct cooling of the high power devices, and is of lower cost than conventional systems. Furthermore, other desirable features and characteristics of the present invention will become apparent from the subsequent detailed description and the appended claims, taken in conjunction with the accompanying drawings and the foregoing technical field and background.

BRIEF SUMMARY

An electrical system configured in accordance with an example embodiment of the invention includes an electrically conductive and thermally conductive bus bar that functions as a signal bus and a thermal conduction heat sink for electrical devices in the system. A separate finned type heat sink arrangement need not be utilized with such a system, thus reducing the cost, size, and complexity of the system. The above and other aspects of the invention may be carried out in one form by an electrical system comprising: an electrically and thermally conductive bus bar configured for coupling to an electrical device input or output node, the bus bar comprising a thermal conduction heat transfer surface; a connection port, located on the bus bar, for interconnecting a signal; and a cold plate thermally coupled to, and electrically insulated from, the thermal conduction heat transfer surface, the cold plate being configured to provide thermal conduction from the bus bar.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

For the sake of brevity, conventional techniques related to electrical power device operation, heat transfer, electrical system fabrication, circuit board fabrication, and other functional aspects of the systems (and the individual operating components of the systems) may not be described in detail herein. Furthermore, the figures contained herein are intended to represent example functional relationships and/or physical couplings between various elements. It should be noted that many alternative or additional functional relationships or physical connections may be present in a practical embodiment.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode).

The following description refers to nodes or features being "connected" or "coupled" together. As used herein, unless expressly stated otherwise, "connected" means that one node/feature is directly connected to (or directly communicates with) another node/feature, and not necessarily mechanically. Likewise, unless expressly stated otherwise, "coupled" means that one node/feature is directly or indirectly coupled to (or directly or indirectly communicates with) another node/feature, and not necessarily mechanically. Thus, although the figures depict example arrangements of elements, additional intervening elements, devices, features, or components may be present in an actual embodiment (assuming that the functionality of the system is not adversely affected).

Figure 1:
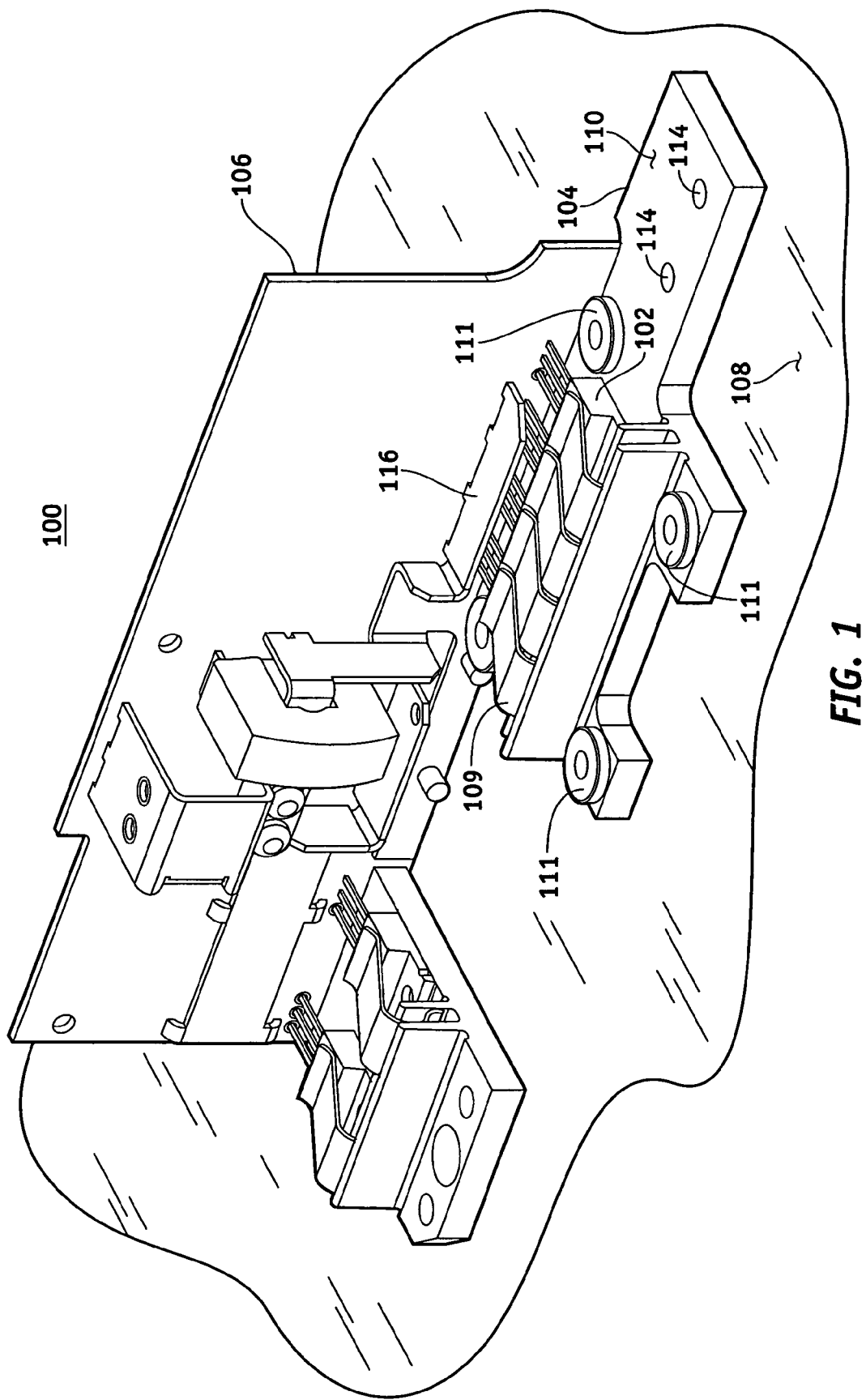
FIG. 1 is a front perspective view of an electrical system configured in accordance with an example embodiment of the invention.
Figure 2:
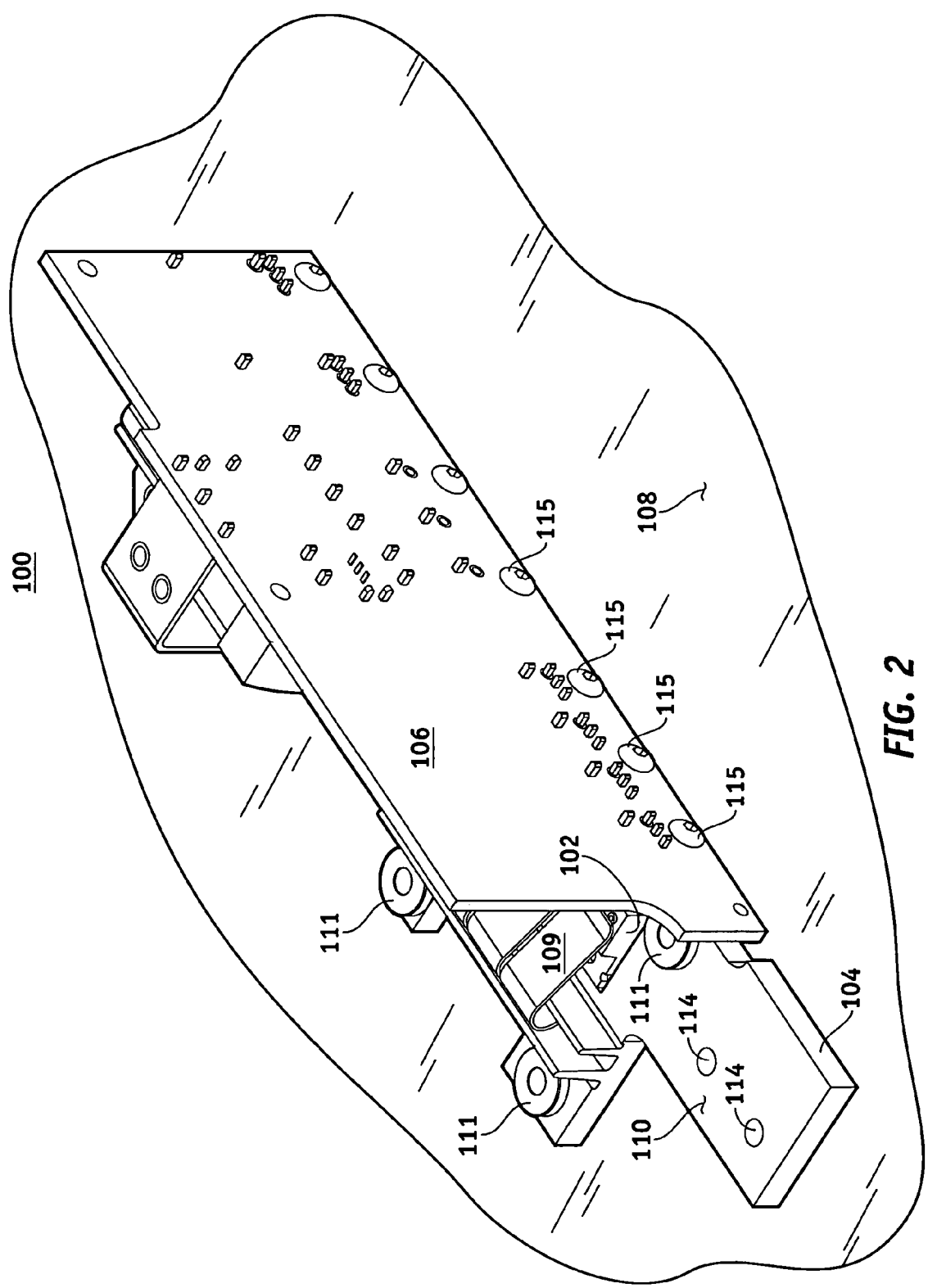
FIG. 2 a rear perspective view of the electrical system shown in FIG. 1.
Figure 3:
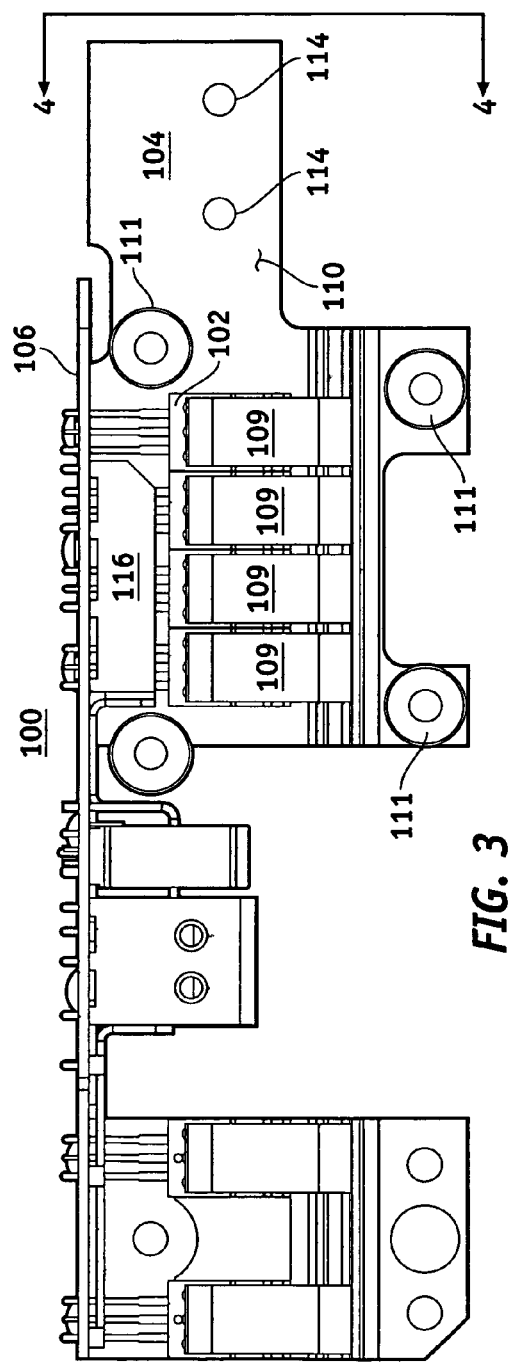
FIG. 3 is a top view of the electrical system shown in FIG. 1.
Figure 4:
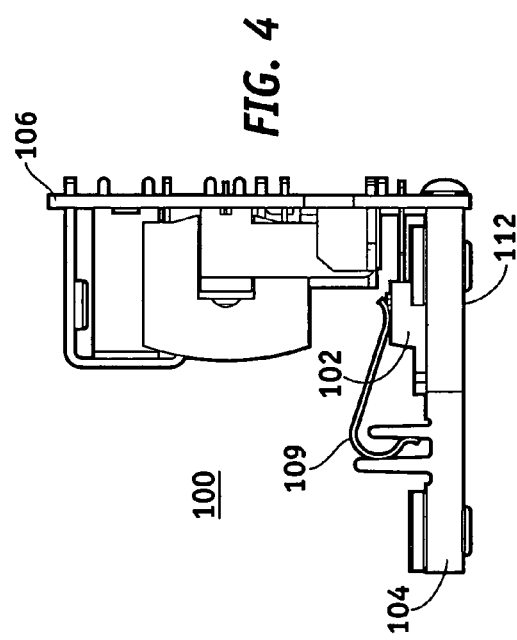
FIG. 4 is a side view of the electrical system shown in FIG. 1, as viewed from line 4-4 in FIG. 3.

FIG. 1 is a front perspective view of an electrical system 100 configured in accordance with an example embodiment of the invention, FIG. 2 a rear perspective view of electrical system 100, FIG. 3 is a top view of electrical system 100, and FIG. 4 is a side view of electrical system 100 as viewed from line 4-4 in FIG. 3. Electrical system 100 represents one practical embodiment of the invention that is suitable for use in connection with a DC-to-DC converter for an electric or hybrid vehicle. The scope of the invention is not limited to such a practical application, however, and the invention may be embodied in a number of different practical configurations.

Electrical system 100 generally includes one or more electrical devices 102, a bus bar 104 coupled to electrical devices 102, a circuit board assembly 106 coupled to bus bar 104 and to electrical devices 102, and a cold plate 108 (only a portion of cold plate 108—the heat transfer interface—is depicted in FIG. 1 and FIG. 2). Bus bar 104 is electrically and thermally conductive, and functions to carry a signal generated or received by electrical devices 102 while concurrently serving as a heat transfer component that provides thermal conduction between electrical devices 102 and cold plate 108.

In this example, electrical devices 102 are power devices such as power transistors, and electrical devices 102 have a common node for a combined signal. In other words, the signal carried by bus bar 104 may be based upon any number of individual signals generated by the individual electrical devices 102. Although not a requirement of the invention, each electrical device 102 described herein is a power transistor having a source node (which serves as a power supply node), a gate node (which serves as a control node), and a drain node (through which practically all of the source node current passes when the control node is biased "on"). In the practical embodiment, each electrical device 102 includes a conductive base portion of the case or package, which may be formed from copper or any suitable electrical and thermal conductor. Moreover, the conductive portion of the case is coupled to, or otherwise corresponds to, the high current node for electrical device 102. In other words, the conductive case of each electrical device 102 may serve as the drain node for that electrical device 102.

Electrical devices 102 are held against bus bar 104 using any suitable technique, component, mechanism, or the like. For example, electrical system 100 may utilize clamps, springs, or clips 109 that impart a force to hold electrical devices 102 in contact with bus bar 104. Alternatively (or additionally), electrical devices 102 can be fastened to bus bar 104 using mounting screws or bolts. In the practical embodiment, a suitable paste, compound, or substance is applied to the junction of electrical devices 102 and bus bar 104 to promote effective and efficient electrical and thermal conductivity. For example, electrical system 100 may utilize a silver-based paste for this purpose.

Bus bar 104 may be coupled to cold plate 108 and/or to a mounting structure using bolts, screws, or any suitable fastening device or technique. In this example, bus bar 104 is secured to cold plate 108 using threaded fasteners 111. Bus bar 104 may include electrically insulating sleeves, grommets, and/or washers (not shown) that insulate threaded fasteners 111 from bus bar 104.

Bus bar 104 is preferably formed from a suitable material having high electrical and thermal conductivity. For example, bus bar 104 may be formed from copper, aluminum, an alloy thereof, or the like. Bus bar 104 includes a device contact surface 110 that is coupled to the drain node of electrical devices 102 to provide the electrical and thermal interface between electrical devices 102 and bus bar 104. In the illustrated embodiment, device contact surface 110 corresponds to the flat upper surface of bus bar 104, and device contact surface 110 is configured to establish electrical contact with an output surface of each electrical device 102, for example, the bottom flat mounting surface of the outer conductive case of each electrical device 102. Bus bar 104 also includes a thermal conduction heat transfer surface 112 (see FIG. 4) that is thermally coupled to, and electrically insulated from, cold plate 108 to provide thermal conduction from bus bar 104.

In operation, electrical devices 102 generate respective high current signals, which in this example represent electrical currents that are combined to form a combined current carried by bus bar 104. Bus bar 104 may include one or more ports 114 for providing this combined signal. As described in more detail below in connection with FIG. 6, a port 114 may be configured as an internally threaded hole that accommodates an externally threaded bolt, pin, or terminal that in turn may be connected to a cable or other suitable electrical conduit.

Referring to FIG. 2, circuit board assembly 106 may be coupled to bus bar 104 using screws, bolts, or any suitable fastening technique or mechanism. In this example, circuit board assembly 106 is held against bus bar 104 using threaded bolts 115, which are received by internally threaded holes formed within the edge of bus bar 104. As described in more detail below, bolts 115 may be electrically conductive and configured to establish an electrical connection between bus bar 104 and one or more conductive traces formed on circuit board assembly 106.

In this example, bus bar 104 is coupled to the drain contacts of electrical devices 102. Electrical system 100 may also include another bus bar 116 that is coupled to the source contacts of electrical devices 102. Bus bar 116 is mounted to circuit board assembly 106, which includes conductive traces (see FIGS. 7 and 8). Notably, bus bar 116 may be cooled using convection techniques such as a finned heat sink.

Figure 5:
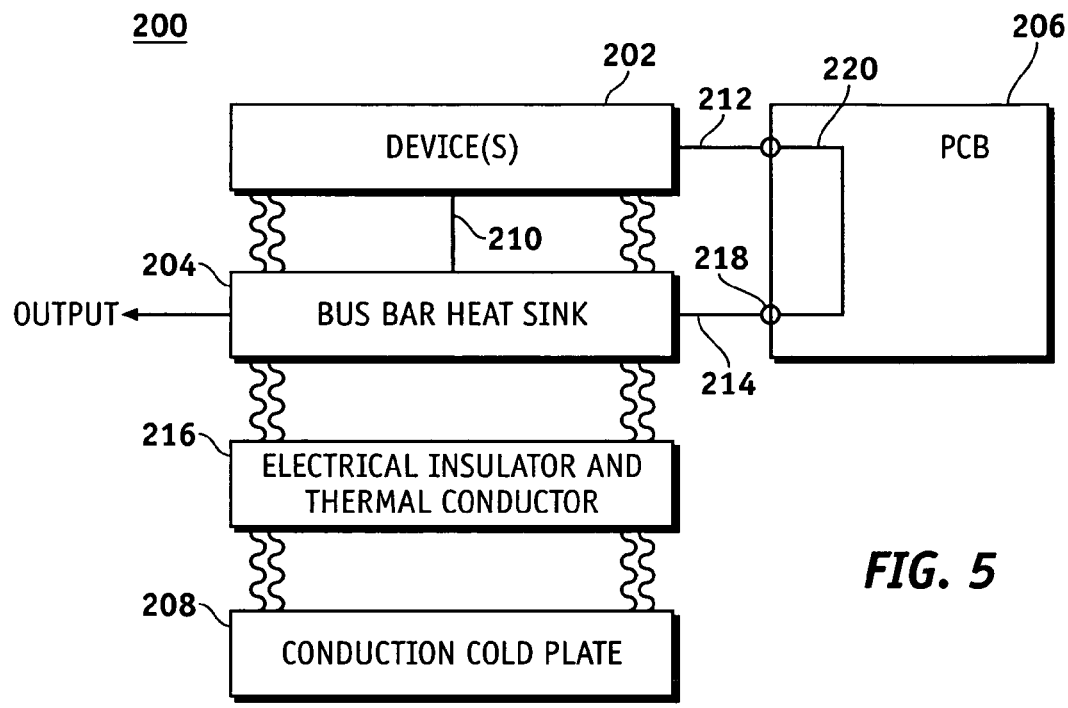
FIG. 5 is a schematic representation of an electrical system configured in accordance with an example embodiment of the invention.

FIG. 5 is a schematic representation of an electrical system 200 configured in accordance with an example embodiment of the invention. Electrical system 200 may be realized as described above for electrical system 100. Electrical system 200 generally includes at least one electrical device 202, a bus bar 204, a circuit board assembly 206, and a cold plate 208 (these components are described above in connection with electrical system 100). FIG. 5 schematically depicts an electrical coupling 210 between electrical devices 202 and bus bar 204, an electrical coupling 212 between electrical devices 202 and circuit board assembly 206, and an electrical coupling 214 between bus bar 204 and circuit board assembly 206. FIG. 5 also schematically depicts thermal couplings (shown as wavy lines) between electrical devices 202 and bus bar 204, between bus bar 204 and an electrical insulator 216, and between electrical insulator 216 and cold plate 208. Electrical system 100 also utilizes an electrical insulator, however, the electrical insulator is hidden from view in FIGS. 1-4.

FIG. 5 schematically illustrates the electrical and thermal paths associated with electrical system 200. Notably, bus bar 204 serves as both an electrical conductor and a heat sink for electrical devices 202. Electrical insulator 216, which is formed from a thermally conductive material, is coupled between the thermal conduction heat transfer surface of bus bar 204 and cold plate 208. In practical embodiments, electrical insulator 216 may be formed from: a ceramic filled silicone material, a polyimide material such as KAPTON®, plastic, polyurethane, or the like. Electrical insulator 216 is utilized in practical deployments where cold plate 208 is formed from an electrically conductive material; electrical insulator 216 prevents current leakage and short circuiting. The thermal conductivity of electrical insulator 216 facilitates efficient heat transfer from bus bar 204 to cold plate 208. In one practical embodiment, cold plate 208 is part of a liquid cooled conduction heat transfer subsystem. For example, cold plate 208 may be realized as an outer wall or an outer surface of a chamber or conduit that carries a suitable coolant. Heat generated by electrical devices 202 is conducted to bus bar 204, through electrical insulator 216, to cold plate 208, and, finally, to the coolant in the chamber or conduit.

Circuit board assembly 206 preferably includes an electrical interface 218 that forms an electrical connection with bus bar 204 when circuit board assembly 206 is coupled to bus bar 204. In one practical embodiment, electrical interface 218 is realized as an electrically conductive interface trace (described in more detail below in connection with FIG. 7) formed on circuit board assembly 206, and the interface trace contacts an edge of bus bar 204 when circuit board assembly 206 is coupled to bus bar 204. In the example embodiment, each electrical device 202 includes a high current pin, and the high current pin is coupled to a conductive trace 220 on circuit board assembly 206. Conductive trace 220 is preferably configured to establish an electrical connection between the electrical interface 218 (e.g., the interface trace on circuit board assembly 206) and the high current pin of the respective electrical device 202. This "redundant" connectivity is schematically depicted within circuit board assembly 206 in FIG. 5. Notably, most of the current generated by electrical devices 202 flows through bus bar 204 to the system connection (rather than through circuit board assembly 206).

Figure 6:
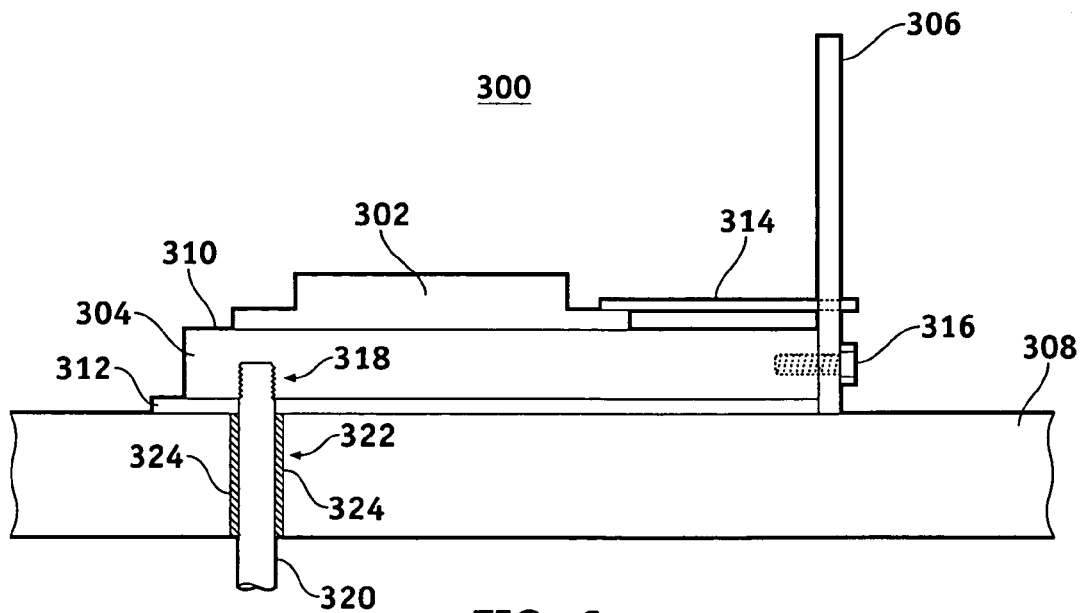
FIG. 6 is a sectional view of an electrical system configured in accordance with an example embodiment of the invention.

FIG. 6 is a sectional view of an electrical system 300 configured in accordance with an example embodiment of the invention. Electrical system 300 shares a number of elements and features with electrical system 100 and electrical system 200, and such common elements and features will not be redundantly described herein. For example, electrical system generally includes an electrical device 302, a bus bar 304 having a device contact surface 310, a circuit board assembly 306, a cold plate 308, and an electrical insulator 312.

Electrical device 302 includes a high current pin 314 corresponding to its electrical node (in the example embodiment, pin 314 represents the drain contact of a power transistor). The lower surface of the conductive case of electrical device 302 also corresponds to the high current node of electrical device 302. As depicted in FIG. 6, electrical device 302 is held against device contact surface 310 such that its conductive case forms an electrical connection with bus bar 304. Although not shown in FIG. 6, bus bar 304 is attached to cold plate 308 using any suitable attachment technique or mechanism. In practice, electrical insulator 312 is located between bus bar 304 and cold plate 308 to electrically insulate bus bar 304 from cold plate 308. Circuit board assembly 306 is attached to bus bar 304 using any suitable attachment technique or mechanism. In the example embodiment, electrical system 300 employs threaded bolts, screws, or other fasteners 316, which are inserted through circuit board assembly 306 and are threaded directly into bus bar 304.

As described above in connection with electrical system 100, bus bar 304 may include a suitably configured input/output port 318 for providing an input/output signal. In this example, input/output port 318 is realized as an internally threaded hole formed in bus bar 304. The threaded hole is configured to receive an externally threaded and electrically conductive bolt, pin, or terminal 320. Terminal 320 can be shaped, sized, and routed in an appropriate manner to suit the needs of the specific application. For example, terminal 320 may be fed through a hole or conduit 322 formed within cold plate 308 (and/or the heat transfer subsystem) to provide electrical access below cold plate 308. In practice, an electrically insulating sleeve 324 inserted within hole 322 can insulate terminal 320 from cold plate 308, which may be electrically conductive.

Figure 7:
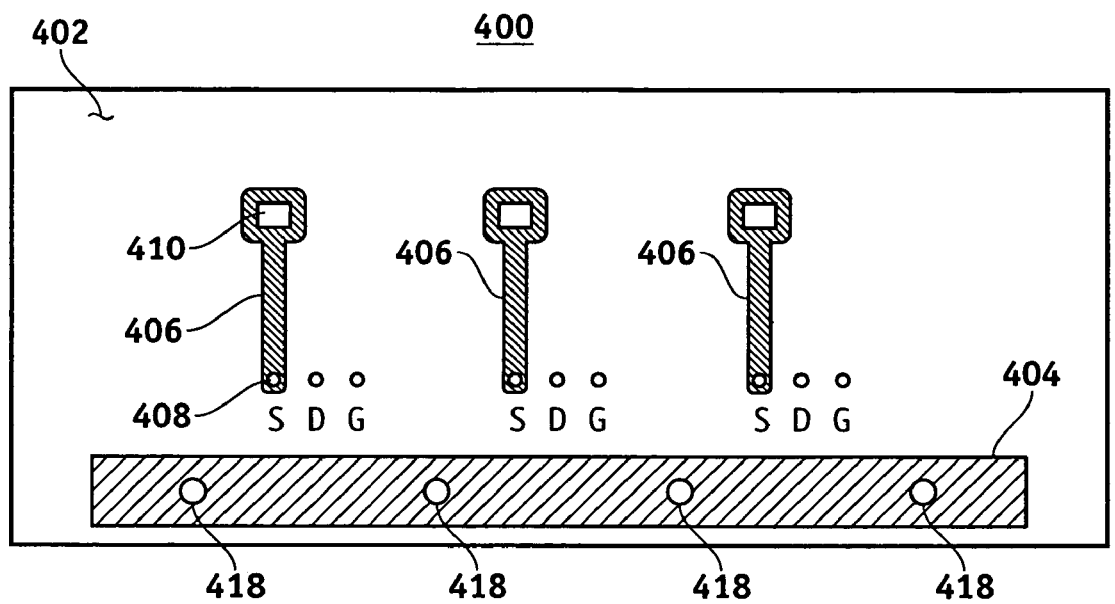
FIG. 7 is a rear view of a circuit board suitable for use in the electrical system shown in FIG. 1.
Figure 8:
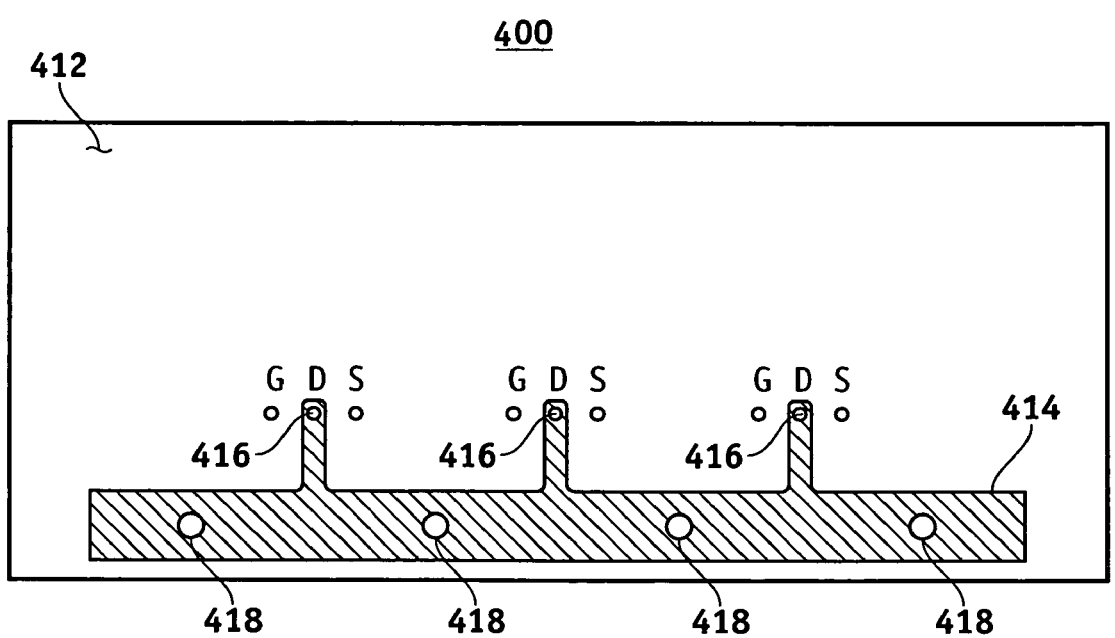
FIG. 8 is a front view of the circuit board shown in FIG. 7.

As described above, a circuit board assembly for the electrical system provides the electrical paths for the electrical devices in the electrical system. In the example embodiment described herein, each electrical device has three pins (for the source, gate, and drain), and each pin is electrically coupled to etched traces formed on the circuit board assembly. In this regard, FIG. 7 is a rear view of a circuit board assembly 400 suitable for use in electrical system 100, and FIG. 8 is a front view of circuit board assembly 400. Circuit board assembly 400 has been simplified to only show the features and elements relevant to the example embodiments of the invention described herein. In practice, circuit board assembly 400 will include additional conductive traces, components, and features that are relatively unimportant for purposes of this description.

The rear side 402 of circuit board assembly 400 generally includes an electrically conductive trace 404 and electrically conductive source traces 406 formed thereon. Each conductive source trace 406 is routed from a respective source pin receptacle 408 to a respective source bus bar receptacle 410. Referring to FIG. 1, source bus bar receptacles 410 are suitably configured and arranged to accommodate prongs or tabs of source bus bar 116 such that source bus bar 116 can be soldered or bonded to conductive source traces 406.

The front side 412 of circuit board assembly 400 generally includes a conductive interface trace 414. As described above, interface trace 414 forms an electrical connection with the bus bar when circuit board assembly 400 is held against the edge of the bus bar. In this regard, interface trace 414 may connect drain pin receptacles 416 together as a common node. In the example embodiment, drain pin receptacles 416 are holes formed through the board of circuit board assembly 400, and the drain pins of the electrical devices are inserted through drain pin receptacles 416 and soldered or bonded to the portions of trace 414 that surround drain pin receptacles 416. Conductive trace 414 provides a parallel connection (in addition to the bus bar connection) for the electrical devices, and conductive trace 414 need not provide a conductive path to other elements or components on circuit board assembly 400.

Moreover, conductive trace 414 and interface trace 404 may be coupled together using conductive vias formed within the board of circuit board assembly 400, or coupled together by way of electrically conductive bolts or fasteners that also serve to attach circuit board assembly 400 to the bus bar (see FIG. 2 and FIG. 6). In this regard, circuit board assembly 400 may include a number of mounting holes 418 formed therein, where mounting holes 418 are located near, or surrounded by, conductive trace 414 and interface trace 404. This parallel connection arrangement ensures that the bus bar, interface trace 404, conductive trace 414, the high current pins of the electrical devices (e.g., the drain pins), and the high current node of the electrical devices (e.g., the conductive cases or packages of the electrical devices) represent a common node for the electrical system.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. An electrical system comprising:
   an electrical power transistor device having a case, a conductive portion of the case, and an output pin, the conductive portion of the case corresponding to an output node for an output signal, and the output pin corresponding to the output node for the output signal;

an electrically and thermally conductive bus bar having a device contact surface and a thermal conduction heat transfer surface, the device contact surface being coupled to the conductive portion of the case of the electrical power transistor device to establish electrical contact therewith, and the bus bar being configured to conduct heat from the electrical power transistor device; and a circuit board assembly having a first electrically conductive interface trace formed on a first side thereof, and a second electrically conductive interface trace formed on a second side thereof, the first electrically conductive interface trace and the second electrically conductive interface trace being electrically coupled together, the circuit board assembly being coupled to the bus bar such that the first electrically conductive interface trace contacts an edge of the bus bar to form an electrical connection with the edge of the bus bar, and the second electrically conductive interface trace being electrically connected to the output pin of the electrical power transistor device such that the conductive portion of the case, the output pin, the bus bar, the first electrically conductive interface trace, and the second electrically conductive interface trace all correspond to the output node.

2. A system according to claim 1, further comprising:
a cold plate thermally coupled to, and electrically insulated from, said thermal conduction heat transfer surface, said cold plate being configured to provide thermal conduction from said bus bar; and
an electrical insulator coupled between said thermal conduction heat transfer surface and said cold plate, said electrical insulator being thermally conductive.

3. A system according to claim 2, said cold plate being liquid cooled.

4. An electrical system according to claim 1, said bus bar further comprising a connection port for providing said output signal.

5. An electrical system according to claim 1, wherein:
the circuit board assembly further comprises an output pin receptacle formed therein;
the output pin receptacle is configured to receive the output pin at the first side of the circuit board assembly and to provide the output pin at the second side of the circuit board assembly; and
the output pin receptacle is electrically coupled to the second electrically conductive interface trace.

* * * * *